US012648395B2

(12) United States Patent
Lin et al.

(10) Patent No.: US 12,648,395 B2
(45) Date of Patent: Jun. 2, 2026

(54) SENSOR SUBSTRATE AND INTEGRATED SENSING SURFACES

(71) Applicant: Applied Materials, Inc., Santa Clara, CA (US)

(72) Inventors: Chuang-Chia Lin, San Ramon, CA (US); Qianyi Xie, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 18/527,065

(22) Filed: Dec. 1, 2023

(65) Prior Publication Data

US 2025/0183074 A1 Jun. 5, 2025

(51) Int. Cl.
H10P 72/50 (2026.01)
H01J 37/34 (2006.01)
H10P 72/00 (2026.01)
H10P 72/30 (2026.01)

(52) U.S. Cl.
CPC ...... H10P 72/0616 (2026.01); H01J 37/3476 (2013.01); H10P 72/3302 (2026.01); H10P 72/50 (2026.01)

(58) Field of Classification Search
None
See application file for complete search history.

(56) References Cited

U.S. PATENT DOCUMENTS 4,469,949 A * 9/1984 Mori ...................... H01L 21/30
250/492.2
5,574,556 A 11/1996 Mori et al.

2005/0265814 A1* 12/2005 Coady ...................... H01L 21/68
414/744.5
2008/0145957 A1* 6/2008 Lee ................... H01L 21/67742
414/217
2015/0348773 A1* 12/2015 Zhu ...................... H01J 37/3467
438/503
2018/0203036 A1* 7/2018 Sadeghian Marnani ...................
B23Q 1/34
2019/0164791 A1* 5/2019 Sugita ............... H01L 21/67265

FOREIGN PATENT DOCUMENTS

CN 117116788 A 11/2023
KR 20120112165 A 10/2012
KR 10140983 B1 6/2014
WO WO-2020154708 A1 * 7/2020 ....... H01L 21/67775

OTHER PUBLICATIONS

International Search Report and Written Opinion for Application No. PCT/US2024/054168 dated Feb. 20, 2025, 13 pgs.

* cited by examiner

*Primary Examiner* — Jason Berman
(74) *Attorney, Agent, or Firm* — Schwabe, Williamson & Wyatt, P.C.

(57) ABSTRACT

Embodiments disclosed herein include sensor modules. In an embodiment, a module comprises a substrate with a first surface, a second surface opposite from the first surface, and a sidewall surface coupling the first surface to the second surface. In an embodiment, a plurality of sensors are provided around a perimeter of the substrate. In an embodiment, the sensors are configured to measure distances between the sidewall surface and an external object. In an embodiment, the module further comprises a processor communicatively coupled to the plurality of sensors.

19 Claims, 10 Drawing Sheets

SENSOR SUBSTRATE AND INTEGRATED SENSING SURFACES

BACKGROUND

1) Field

Embodiments relate to the field of semiconductor manufacturing and, in particular, to sensors integrated into substrates, wafers, blades, chucks, or the like.

2) Description of Related Art

In semiconductor manufacturing environments, robots are often used in order to transport substrates (e.g., wafers, etc.) through a processing tool. Precise control of the robots is necessary in order to accurately place substrates at desired locations within the processing tool. For example, substrates need to properly centered on a chuck or pedestal in order to provide uniform and repeatable results during processing operations (e.g., etching processes, deposition processes, treatment processes, etc.).

While robots may include integrated positioning sensors to track movement, these sensors typically do not have the capacity to track actual wafer positions. Accordingly, it is desirable to "train" a robot so that the robot produces an accurate and repeatable substrate transfer operation. This training process may be done when the tool is brought on line, after planned maintenance, or at any other designated interval. Existing training solutions include manual operation, which is time-consuming and costly.

Additionally, measurement of wafer profiles are needed in order to perform accurate and repeatable processes on the wafer. As such, dedicated scanners and the like are often used to measure wafer bow, warpage, and/or the like. However, such measurement processes are time consuming and require additional equipment, which decreases throughput and increases costs.

SUMMARY

Embodiments disclosed herein include sensor modules. In an embodiment, a module comprises a substrate with a first surface, a second surface opposite from the first surface, and a sidewall surface coupling the first surface to the second surface. In an embodiment, a plurality of sensors are provided around a perimeter of the substrate. In an embodiment, the sensors are configured to measure distances between the sidewall surface and an external object. In an embodiment, the module further comprises a processor communicatively coupled to the plurality of sensors.

Embodiments disclosed herein may further comprise a support surface with an array of sensors coupled to the support surface. In an embodiment, the sensors are configured to measure a distance between the module and an object external to the module. In an embodiment, the distance is in a direction substantially orthogonal to the support surface. In an embodiment, the module may further comprise a processor coupled to the array of sensors.

Embodiments disclosed herein may further comprise a semiconductor processing tool. In an embodiment, the tool comprises a factory interface with an aligner and a wafer handling robot. In an embodiment, one or both of the aligner and the wafer handling robot comprise a plurality of sensors for measuring distances between a support surface and a wafer to determine a bow of the wafer. In an embodiment, a load lock is coupled to the factory interface, and a processing chamber is coupled to the load lock.

DETAILED DESCRIPTION

Figure 1A:
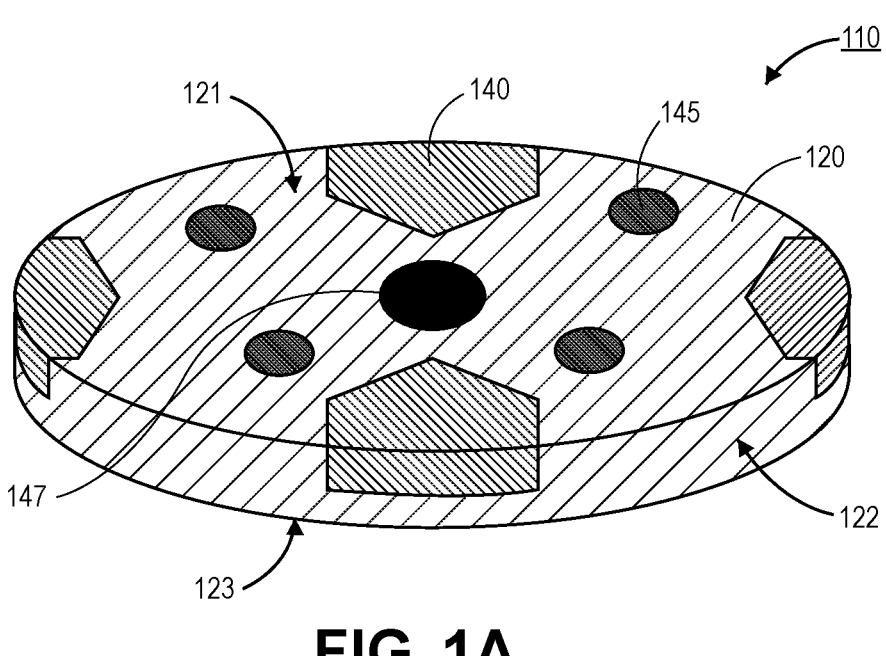
FIG. 1A is a perspective view illustration of a sensor substrate that is used for robot training within a semiconductor processing tool, in accordance with an embodiment.

Systems described herein include sensors integrated into substrates, wafers, blades, chucks, or the like for enabling robot teaching and/or wafer bow measurement. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Various embodiments or aspects of the disclosure are described herein. In some implementations, the different embodiments are practiced separately. However, embodiments are not limited to embodiments being practiced in isolation. For example, two or more different embodiments can be combined together in order to be practiced as a single device, process, structure, or the like. The entirety of various embodiments can be combined together in some instances. In other instances, portions of a first embodiment can be combined with portions of one or more different embodiments. For example, a portion of a first embodiment can be combined with a portion of a second embodiment, or a portion of a first embodiment can be combined with a portion of a second embodiment and a portion of a third embodiment.

As noted above, the ability to teach robots to accurately place substrates (e.g., wafers, etc.) enables higher speeds (which leads to higher throughput) and improved processing outcomes on the wafers. Manual teaching is currently used, and some sensor based teaching tools have been proposed. Manual training is slow and subject to human error. Proposed sensor based solutions rely on sensing technologies that have relatively long sensing times. For example, imaging solutions (e.g., cameras) have been proposed, but camera technologies require extensive processing in order to extract distance and positioning information. Further, integrating the sensed data with software for controlling the robot is an additional time consuming process. Additionally, sensors need to be customized for various environments. This limits cost savings since devices cannot operate between different tools or setups. The time consuming and costly process is made even more problematic because the training needs to be periodically repeated. For example, training is done at tool setup, after planned maintenance (PM), after excursions are detected, and/or at any other designated interval.

Accordingly, embodiments disclosed herein include the use of a sensor substrate that has fast and accurate distance sensing capabilities. In some instances, the sensors include capacitive sensors. Capacitive sensors can be used to measure accurate and precise distances between objects. Embodiments disclosed herein may also include mutual capacitance sensor structures. As such, the opposing object does not need to be electrically conductive or be part of an electronic circuit with the capacitive sensor structure. Accordingly, the sensors can be used in many different types of processing tools.

In an embodiment, the sensors are oriented along a sidewall of the sensor substrate. This allows for the sensor substrate to measure distances between the sensor substrate and a vertical portion (e.g., a sidewall) of the pedestal or chuck. As such, the sensor substrate is capable of determining if the sensor substrate is properly centered on the pedestal or chuck. This information can be transmitted to the robot controller in order to train the robot to improve placement of substrates or wafers.

While capacitive sensors may be particularly beneficial for fast and accurate distance sensing, other embodiments may include the use of laser or interferometer sensors in order to sense distances as well. In some embodiments, both capacitive and laser and/or interferometer sensors can be used. Additionally, some embodiments may include an accelerometer in order to measure when a sensor substrate makes contact with the pedestal or chuck.

Sensor substrates are one application space for the use of capacitive sensor technology within a semiconductor processing tool. Other applications may include support surfaces within the semiconductor processing tool. For example, robot blades, aligner surfaces, and/or the like may also integrate distance sensors. Integrating an array of distance sensors in such applications may allow for wafer bowing or warpage to be detected while the wafer is in transit. This may eliminate the need for a discrete station to measure wafer warpage, and throughput can be increased. Distances sensors suitable for such applications may include capacitive sensors and/or interferometer sensors.

Referring now to FIG. 1A, a perspective view illustration of a sensor substrate 110 is shown, in accordance with an embodiment. The sensor substrate 110 may comprise a substrate 120. The substrate 120 may have a form factor that is similar to tradition wafer form factors (e.g., 300 mm, 450 mm, etc.). A thickness of the substrate 120 may also be similar to those of traditional wafers. For example, the substrate 120 may have a thickness that is less than approximately 3 mm or less than approximately 1 mm. The substrate 120 may comprise any suitable material or materials, such as, but not limited to, silicon, organic dielectrics (e.g., a printed circuit board (PCB) material), metal, and/or the like.

In an embodiment, the substrate 120 may have a first surface 121 (e.g., a top surface 121), a second surface 123 (e.g., a bottom surface 123), and a sidewall surface 122 that connects the first surface 121 to the second surface 123. The sidewall surface 122 may be substantially vertical in some embodiments. As used herein, "substantially vertical" may refer to a surface that is within 10 degrees of being orthogonal to the first surface 121. The first surface 121 may be substantially parallel to the second surface 123. As used herein, "substantially parallel" may refer to two surfaces that are within 10 degrees of being parallel to each other.

In an embodiment, the sensor substrate 110 may comprise a plurality of sensors distributed about the substrate 120. For example, the plurality of sensors integrated into sensor substrate 110 may include first sensors 140, second sensors 145, and a third sensor 147. While three different types of sensors 140, 145, and 147 are shown in FIG. 1A, it is to be appreciated that a single type of sensor, or two or more types of sensors can be used in some embodiments.

In an embodiment, the first sensors 140 may be arranged around a perimeter of the substrate 120. As used herein, the "perimeter" may refer to an outer edge of a surface and/or a sidewall of solid body (e.g., the substrate 120). Being provided, arranged, or attached around a perimeter of the substrate 120 may refer to first sensors 140 being immediately adjacent to the perimeter or outer edge, being within approximately 10 mm of the perimeter or outer edge, or at least closer to the perimeter or outer edge than to a center of the substrate 120. The first sensors 140 may include a portion that is provided along the top first surface 121 and a portion that is provided along the sidewall surface 122. The portion along the sidewall surface 122 may be the sensing element (or elements) that detect a distance between the sidewall surface 122 and an external object (not shown). For example, first sensors 140 may be used to determine centering of the sensor substrate 110 on a pedestal or chuck that includes sidewalls around the support surface of the pedestal or chuck.

The first sensors 140 may include capacitive sensors. More particularly, the first sensors 140 may include a mutual capacitance structure that uses a pair of adjacent electrodes, as will be described in greater detail below. In the illustrated embodiment, four first sensors 140 are shown. Though, embodiments may include three or more first sensors 140 in some embodiments. While capacitive sensors may be used for one option, other sensor types may also be used in some instances. For example, a distance sensor that relies on a laser, such as an interferometer, may be used for the first sensors 140.

In an embodiment, the second sensors 145 may be arranged across the first surface 121 or the second surface 123 of the substrate 120. The second sensors 145 may be oriented so that they sense distances that are in a direction substantially orthogonal to a sensing direction of the first sensors 140. As used herein, "substantially orthogonal" may refer to two lines or planes that are within 10 degrees of being orthogonal to each other. The second sensors 145 may be used to measure a distance between a bottom of the sensor substrate 110 and the support surface of the pedestal or chuck or a distance between the bottom of the sensor substrate 110 and lift pins of the pedestal or chuck.

The second sensors 145 may include capacitive sensors, such as a mutual capacitance structure. In the illustrated embodiment, four second sensors 145 are shown. Though, embodiments may include one or more second sensors 145. While capacitive sensors may be used for one option, other sensor types may also be used in some instances. For example, a distance sensor that relies on a laser, such as an interferometer, may be used for the second sensor 145.

In an embodiment, the third sensor 147 may be provide on the first surface 121 of the substrate 120. The third sensor 147 may also be embedded or partially embedded in the substrate 120. The third sensor 147 may include an accelerometer in some embodiments. The use of an accelerometer may allow for acceleration of the sensor substrate 110 to be detected while being moved by a robot. An accelerometer third sensor 147 may be particularly useful to determine when the sensor substrate 110 is brought into contact with the support surface of the pedestal or chuck.

Figure 1B:
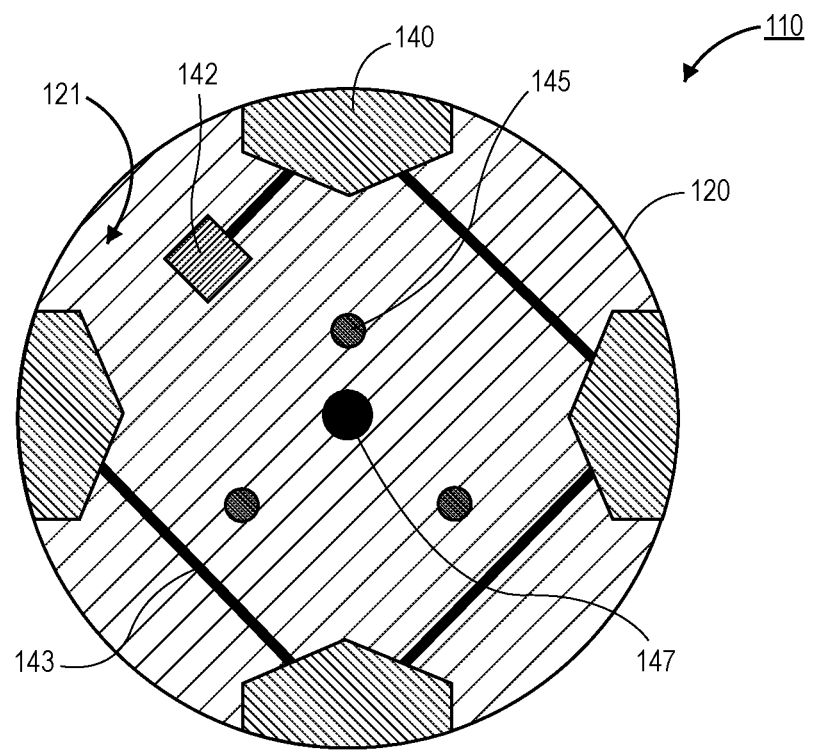
FIG. 1B is a plan view illustration of a sensor substrate with sensors for robot training, in accordance with an embodiment.

Referring now to FIG. 1B, a plan view illustration of the sensor substrate 110 is shown, in accordance with an embodiment. The substrate 110 may be substantially similar to the substrate 110 shown in FIG. 1A, with the addition of interconnect structures and a processor. In an embodiment, the first sensors 140 may be electrically coupled to each other by electrically conductive traces 143. The traces 143 may be provided on the first surface 121. In other embodiments, the traces 143 may be embedded in the substrate 120, underneath a solder resist layer (not shown), or the like. The first sensors 140 may be electrically coupled to each other in series. Though, other interconnect architectures may also be used. For example, each of the first sensors 140 may be electrically connected directly to the processor 142.

In an embodiment, the electrical routing between the second sensors 145 and the processor 142 is not shown, and the electrical routing between the third sensors 147 and the processor 142 is not shown. Though, it is to be appreciated that electrically conductive routing in or over the substrate 120 may electrically couple each sensor 140, 145, and 147 to the processor 142.

In an embodiment, the processor 142 may include any number of computing and/or communication components. For example, the processor 142 may comprise a central processing unit (CPU) or the like and a memory storage component. In such instances, data detected by the sensors 140, 145, and 147 may be stored in memory, and the data may subsequently be offloaded from the sensor substrate 110 for use. In other embodiments, the processor 142 may comprise a communication module (e.g., transceiver circuitry, an antenna, etc.). When a communication module is included on the sensor substrate 110, the data can be transmitted to an external device (e.g., an external server, a computer on the robot, etc.) for simultaneous (or near simultaneous) use.

Figure 2:
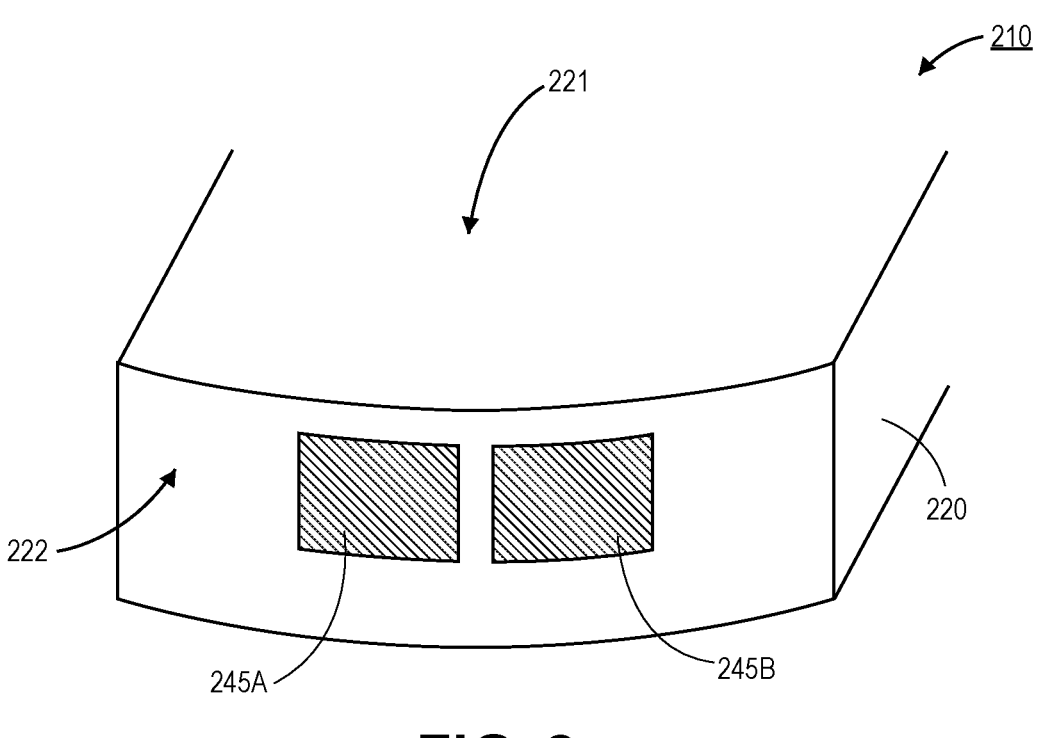
FIG. 2 is a partial sectional view of a sidewall surface of a sensor substrate that includes a capacitive sensor with a first electrode and a second electrode, in accordance with an embodiment.

Referring now to FIG. 2, a perspective view of a portion of a sensor substrate 210 is shown, in accordance with an embodiment. In FIG. 2, a slice of the substrate 220 that shows the top surface 221 and the sidewall surface 222 is shown, in accordance with an embodiment. A sensor 245 may be provided along the sidewall surface 222. In an embodiment, the sensor 245 is a mutual capacitance sensor. As such, there is a first electrode 245A that is adjacent to a second electrode 245B. The first electrode 245A and the second electrode 245B may be substantially similar to each other in dimension and vertical placement along the sidewall surface 222. The first electrode 245A and the second electrode 245B may be rectangular, circular, or any other suitable shape. A gap between the first electrode 245A and the second electrode 245B may be up to approximately 5 mm, up to approximately 1 mm, or up to approximately 0.5 mm. In an embodiment, the first electrode 245A and the second electrode 245B May comprise an electrically conductive material. For example, the first electrode 245A and the second electrode 245B may comprise copper, aluminum, gold, silver, alloys thereof, or the like.

In an embodiment, the first electrode 245A and the second electrode 245B may be capacitively coupled to each other. That is, electric field lines may pass between the two electrodes 245A and 245B to generate an electrical field. As an external object is brought into the electrical field, the measured capacitance between the first electrode 245A and the second electrode 245B changes. The magnitude of the change can be converted into a distance between the sidewall surface 222 and the external object (not shown).

In the illustrated embodiment, the electrodes 245A and 245B are shown in isolation. However, electrical paths (e.g., traces, etc.) may connect the electrodes 245A and 245B to a processor (not shown) or the like. For example, traces may extend up the sidewall 222 and wrap along the top surface 221 of the substrate 220. In other embodiments, electrical routing may be embedded within the substrate 220.

Figure 3:
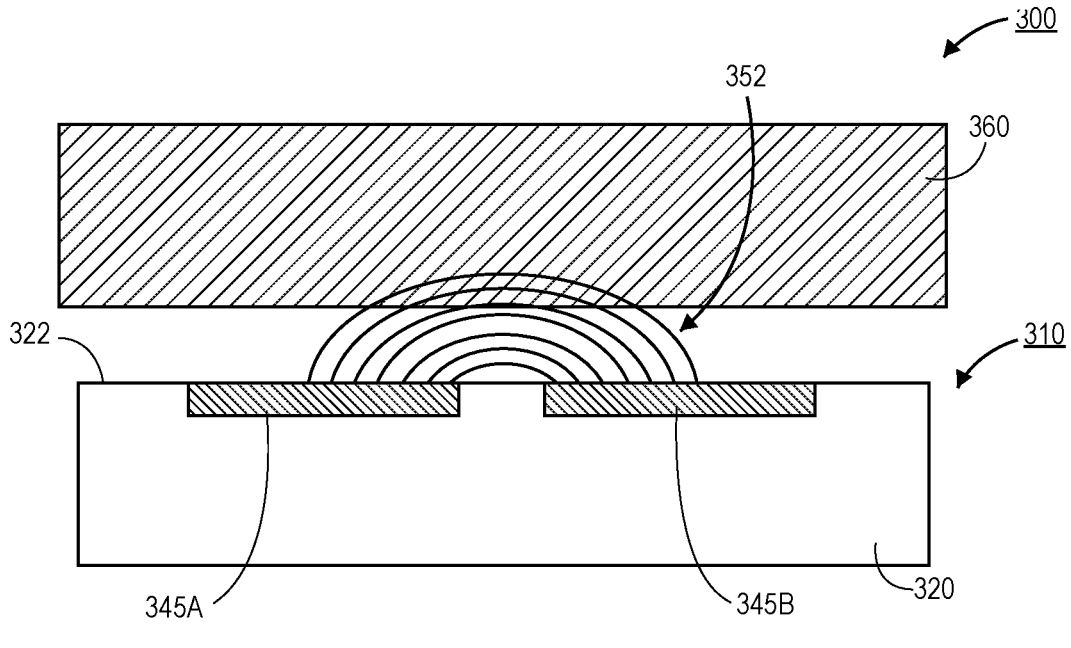
FIG. 3 is a plan view illustration of a sensor substrate with capacitive sensors sensing a distance between an edge of the substrate and an external object, in accordance with an embodiment.

Referring now to FIG. 3, a plan view illustration of a system 300 looking down at a portion of an edge of the sensor substrate 310 is shown, in accordance with an embodiment. As shown, the sidewall 322 of the substrate 320 faces towards an external object 360. The external object 360 may be part of a pedestal or chuck in a semiconductor processing tool. Though, the external object 360 may be any type of object.

In an embodiment, a first electrode 345A and a second electrode 345B are provided on the sidewall surface 322. As shown, the electrodes 345A and 345B are flush with the sidewall surface 322. In other instances, the electrodes 345A and 345B may be placed on the sidewall surface 322 so that they extend away from the sidewall surface 322. The electrodes 345A and 345B may be electrically coupled to external circuitry, such as a processor or communication module (not shown).

As shown, an electric field 352 is generated between the first electrode 345A and the second electrode 345B. When the object 360 interacts with the electric field 352, the capacitance measured by the electrodes 345A and 345B changes. The change in capacitance can be correlated with a distance between the object 360 and the sidewall surface 322. Capacitive measurements can be extremely accurate (to within approximately 10 μm or to within approximately 5 μm) in some embodiments. The use of capacitance also allows for rapid distance detection, which speeds up the robot training process.

While capacitive sensor architectures are described in embodiments above, embodiments are not limited to the use of capacitance based devices. For example, FIGS. 4A-5B include either laser based solutions, or solutions that include laser based sensors and capacitance based sensors.

Figure 4A:
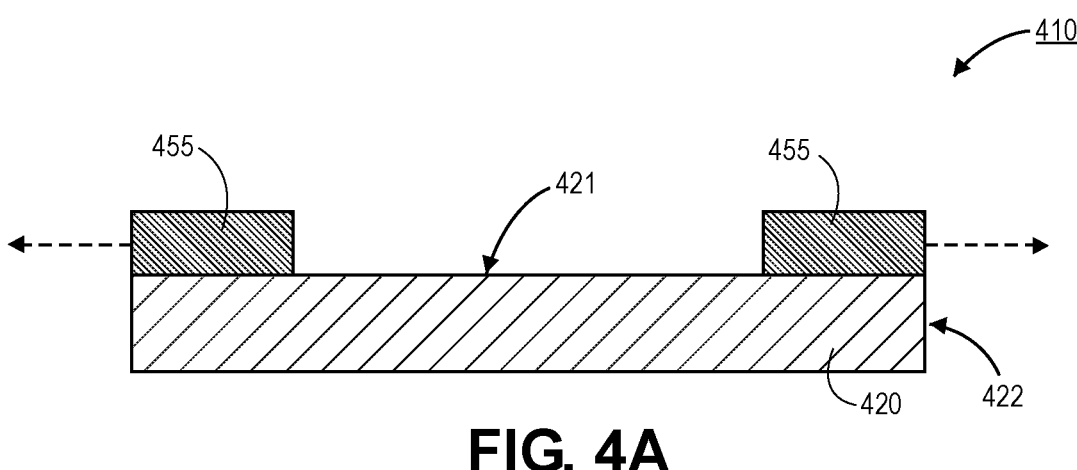
FIG. 4A is a cross-sectional illustration of a sensor substrate with horizontally oriented lasers that are provided above a top surface of the substrate, in accordance with an embodiment.

Referring now to FIG. 4A, a cross-sectional illustration of a sensor substrate 410 is shown, in accordance with an embodiment. The sensor substrate 410 may include a substrate 420 with a top surface 421. The substrate 420 may be similar to any of the substrates described in greater detail herein. In an embodiment, sensors 455 may be arranged around a perimeter of the substrate 420. The sensors 455 may be placed at or around the edge of the top surface 421. For example, an edge of the sensor 455 may be within 5 mm of the sidewall surface 422 of the substrate 420. The sensor 455 may be oriented so that a distance measurement is made in a direction substantially orthogonal to the sidewall surface 422. In an embodiment, the sensors 455 may be laser based sensors. That is, laser light may be used, at least in part, to determine a distance between the sidewall surface 422 and an external object (not shown). In one embodiment, the sensors 455 may be interferometer sensors.

While not shown, it is to be appreciated that the sensors 455 may be electrically coupled to each other and/or to a processor or communication module. For example, electrically conductive traces may be provided over the top surface 421 in some embodiments. Additionally, other sensors in different orientations may also be provided. An accelerometer may also be integrated into the sensor substrate 410.

Figure 4B:
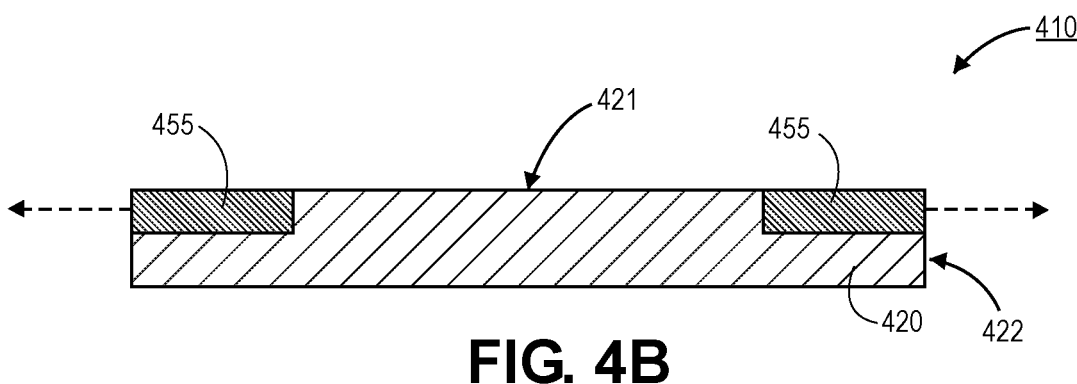
FIG. 4B is a cross-sectional illustration of a sensor substrate with horizontally oriented lasers embedded within the substrate, in accordance with an embodiment.

Referring now to FIG. 4B, a cross-sectional illustration of a sensor substrate 410 is shown, in accordance with an additional embodiment. In an embodiment, the sensor substrate 410 is similar to the sensor substrate 410 in FIG. 4A, with the exception of the placement of the sensors 455. Instead of being provided on the top surface 421, the sensors 455 may be at least partially embedded in the substrate 420. Embedding the sensors 455 into the substrate 420 can reduce the overall thickness of the sensor substrate 410, which may be beneficial for some applications.

Figure 4C:
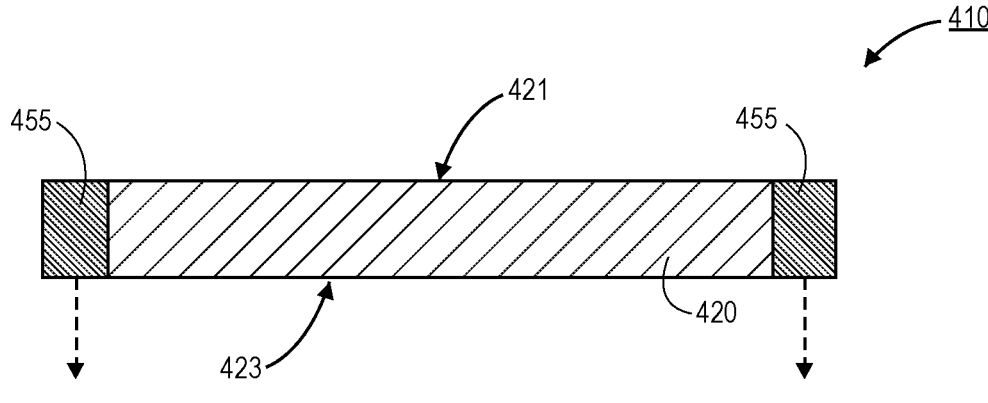
FIG. 4C is a cross-sectional illustration of a sensor substrate with vertically oriented laser embedded within the substrate, in accordance with an embodiment.

Referring now to FIG. 4C, a cross-sectional illustration of a sensor substrate 410 is shown, in accordance with an additional embodiment. In an embodiment, the sensor substrate 410 is similar to the sensor substrate 410 in FIG. 4A, with the exception of the orientation and placement of the sensors 455. Instead of being oriented to measure distances orthogonal to the sidewall surface 422, the sensors 455 are oriented to measure distances substantially orthogonal to the bottom surface 423. Such an embodiment may be useful for determining when the sensor substrate 410 passes over an edge, a sidewall, and/or other topography in a semiconductor processing tool.

Figure 5A:
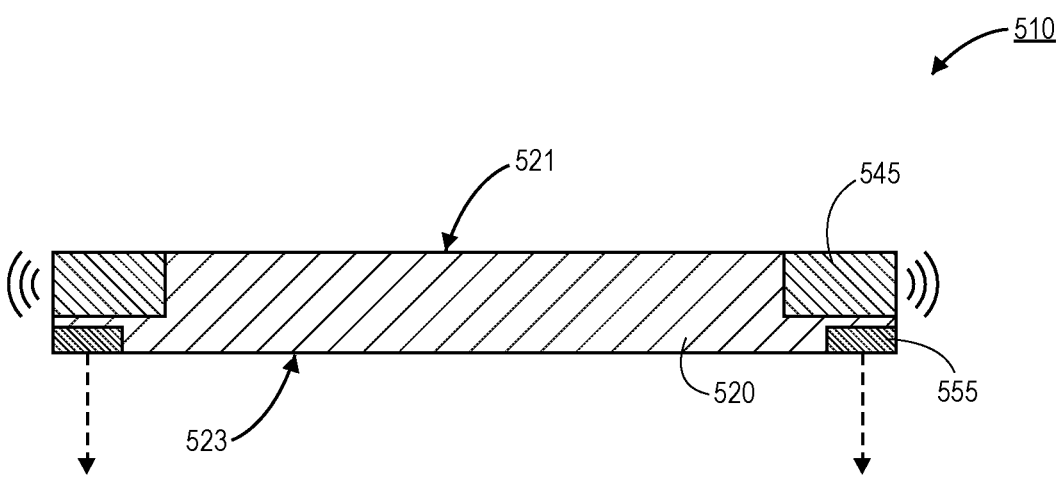
FIG. 5A is a cross-sectional illustration of a sensor substrate with laser sensors and capacitive sensors, in accordance with an embodiment.

Referring now to FIG. 5A, a cross-sectional illustration of a sensor substrate 510 is shown, in accordance with an embodiment. The sensor substrate 510 may include a substrate 520 with a top surface 521 and a bottom surface 523. In an embodiment, first sensors 545 and second sensors 555 may be provided on the substrate 520. The first sensors 545 may be capacitance based sensors, such as those described in greater detail herein. The first sensors 545 may be used for measuring distances between the edge of the substrate and an external object (not shown). The second sensors 555 may be laser based sensors, such as those described in greater detail herein. The second sensors 555 may be oriented to face down away from the bottom surface 523. The second sensors 555 may be used for edge detection functionality.

Figure 5B:
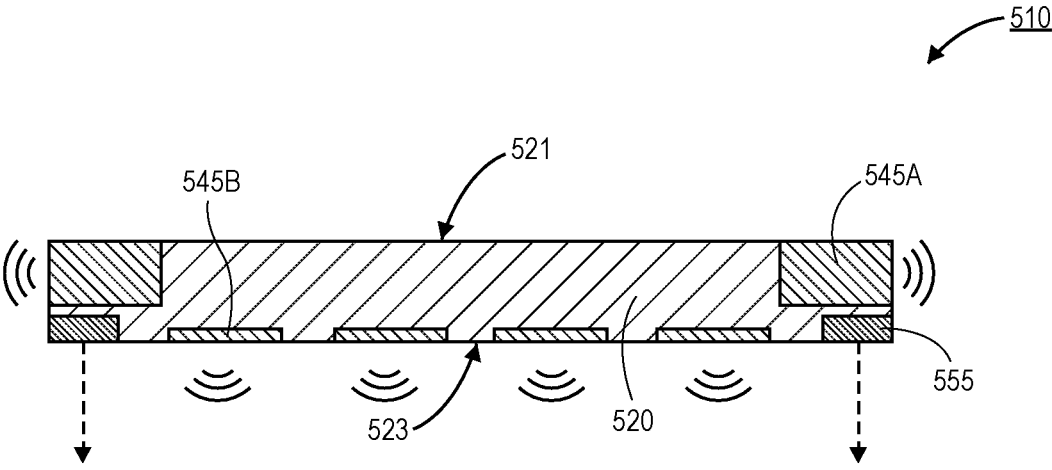
FIG. 5B is a cross-sectional illustration of a sensor substrate with laser sensors and capacitive sensors, in accordance with an additional embodiment.

Referring now to FIG. 5B, a cross-sectional illustration of a sensor substrate 510 is shown, in accordance with an additional embodiment. In an embodiment, the sensor substrate 510 in FIG. 5B may be similar to the sensor substrate 510 in FIG. 5A, with the addition of first sensors 545A and first sensors 545B that are oriented substantially orthogonal to each other. For example, first sensors 545A are oriented to measure a distance orthogonal to the sidewall surface, and first sensors 545B are oriented to measure a distance orthogonal to the bottom surface 523.

Figure 6A:
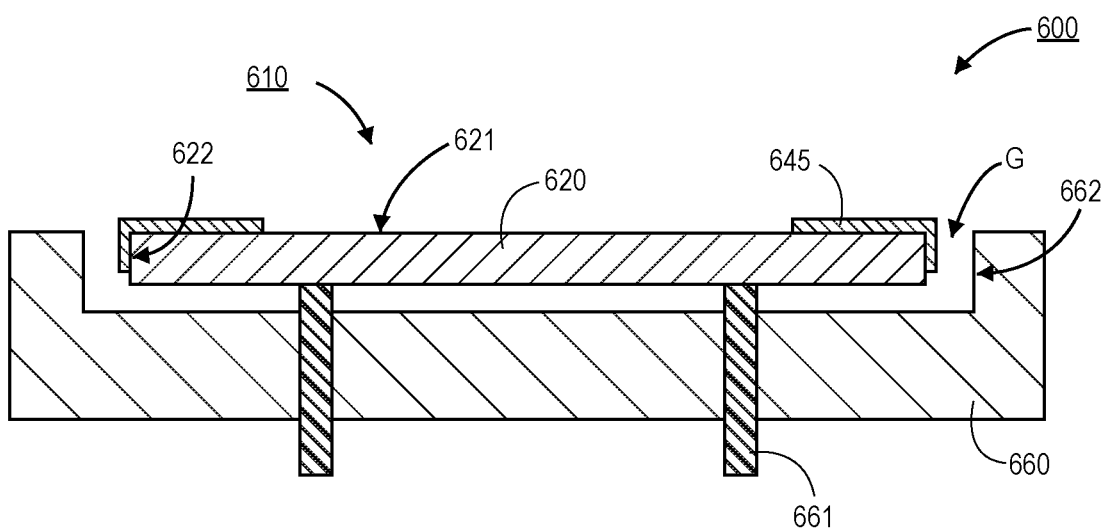
FIG. 6A is a cross-sectional illustration of a system with a sensor substrate that is placed onto a pedestal with vertical sidewalls, in accordance with an embodiment.

Referring now to FIG. 6A, a cross-sectional illustration of a system 600 is shown, in accordance with an embodiment. The system 600 may be part of a semiconductor processing tool. In an embodiment, a pedestal 660 is provided in the system 600. The pedestal 660 (or chuck) may be a surface on which a substrate or wafer is placed during processing operations. The pedestal 660 may have temperature control functionality (e.g., fluidic paths for heating/cooling fluid, resistive heaters, etc.) and/or functionality to secure the wafer or substrate (e.g., electrostatic chucking, vacuum chucking, etc.). In an embodiment, the pedestal 660 may include a recess in which the substrate or wafer sits. The recess may have sidewalls 662. Lift pins 661 may pass through the pedestal 660 to lower wafers onto the pedestal 660.

In an embodiment, a sensor substrate 610 is provided on the lift pins 661. The sensor substrate 610 may be similar to any of the sensor substrates described in greater detail herein. For example, the sensor substrate 610 may include a substrate 620 with a top surface 621 and a sidewall surface 622. In an embodiment sensors 645 may cover at least a portion of the sidewall surface 622. The sensors 645 may be capacitive based sensors, laser based sensors, or any other suitable distance sensor. In an embodiment, the sensors 645 may measure a gap G that is formed between the sensors 645 and the sidewalls 662 of the pedestal. By monitoring the gap G at different locations, the accuracy of the centering placement of the sensor substrate 610 can be determined. If the centering placement is not accurate enough, the control of the robot that placed the sensor substrate 610 onto the lift pins 661 can be modified.

Figure 6B:
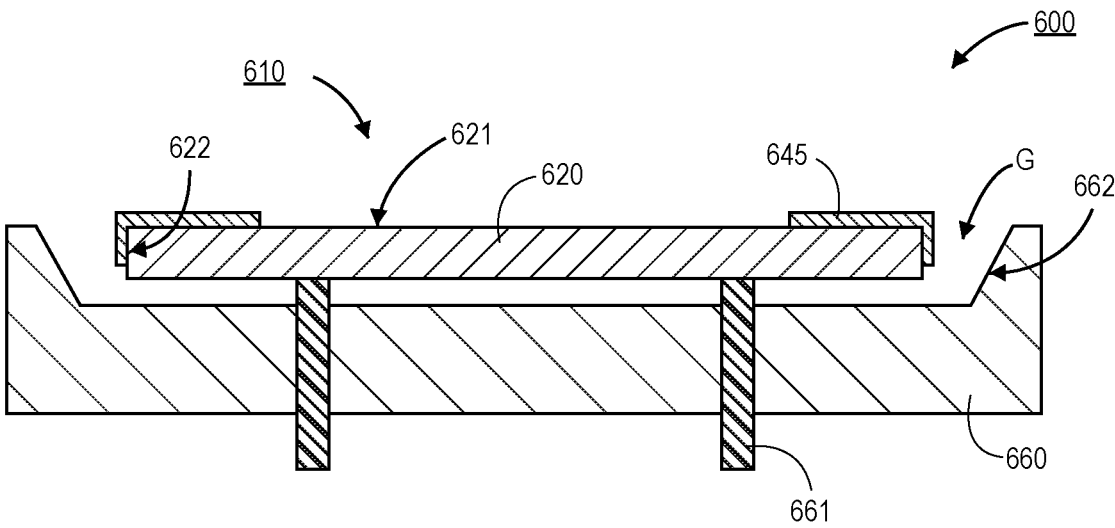
FIG. 6B is a cross-sectional illustration of a system with a sensor substrate that is placed onto a pedestal with sloped sidewalls, in accordance with an embodiment.

Referring now to FIG. 6B, a cross-sectional illustration of a system 600 is shown, in accordance with an additional embodiment. In an embodiment, the system 600 in FIG. 6B may be similar to the system 600 in FIG. 6A, with the exception of the structure of the pedestal 660. For example, sidewalls 662 of the pedestal 660 may have a non-vertical slope. More generally, it is to be appreciated that the sensor substrate 610 can be used in conjunction with a variety of different pedestal 660 configurations. For example, different profiles, different materials (e.g., dielectric or metallic) can all be accommodated by sensor substrate 610 similar to one or more of the sensor substrates described in greater detail herein.

In addition to robot teaching embodiments, similar integrated sensor technologies can be utilized in other locations within a semiconductor processing tool. One application that may benefit from distance sensor technology is in the transportation or aligning of wafers. For example, distance sensors can be integrated into the supporting surfaces of various components, and the distance sensors can be used to measure bowing or warpage of the wafer. When distance sensors such as those described in greater detail herein are used, the scanning time to determine wafer bowing or warpage may be less than a second. For example, the bowing or warpage measurement may be executed in several milliseconds (e.g., 20 ms or less, 10 ms or less, or 5 ms or less). Existing scanning methods may take tens of seconds or even minutes. As such, there is significant time savings.

Figure 7A:
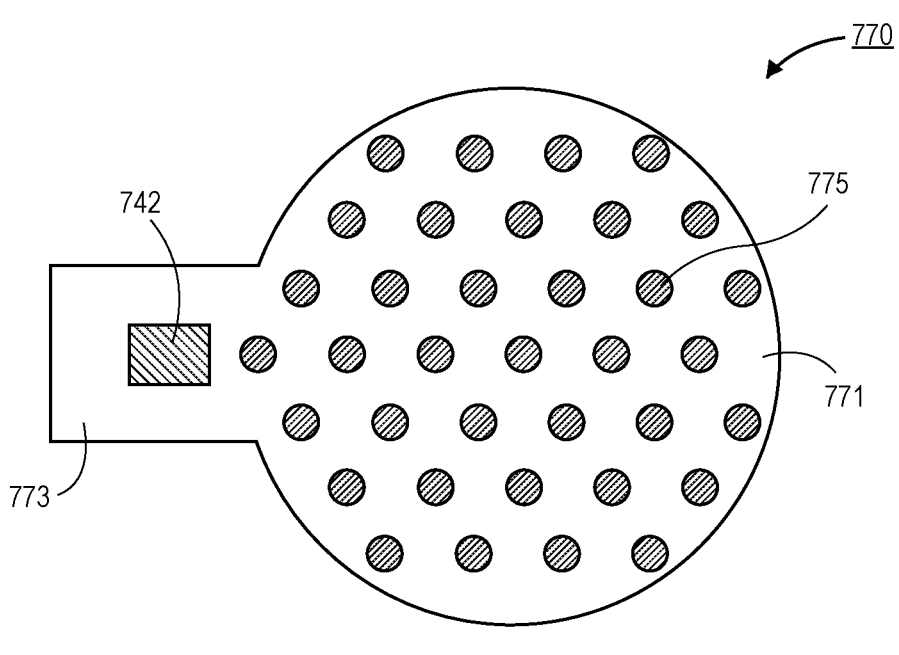
FIG. 7A is a plan view illustration of a robot blade with sensors for detecting wafer bow or warpage, in accordance with an embodiment.

Referring now to FIG. 7A, a plan view illustration of a robot blade 770 is shown, in accordance with an embodiment. The robot blade 770 (or portions of the robot blade 770) may sometimes be referred to as an end effector. The robot blade 770 may include a support surface 771 on which the wafer or substrate is supported during transportation. A handle or arm 773 may couple the support surface 771 to a robot (not shown).

In an embodiment, an array of sensors 775 may be distributed across the support surface 771. The sensors 775 may be similar to any of the sensor architectures described in greater detail herein. For example, the sensors 775 may comprise capacitance based sensors (e.g., mutual capacitance sensors) or laser based sensors (e.g., interferometer sensors). In an embodiment, a processor 742 may be provided on the robot blade 770. In the illustrated embodiment, the processor 742 is in the arm 773, though the processor 742 may be placed anywhere on the robot blade 770. The processor 742 may also be on the robot in some embodiments. The processor 742 may comprise one or more of a CPU, a memory, a communication module, or the like. The sensors 775 may be electrically coupled to the processor 742 through any trace or interconnect architecture (not shown).

Figure 7B:
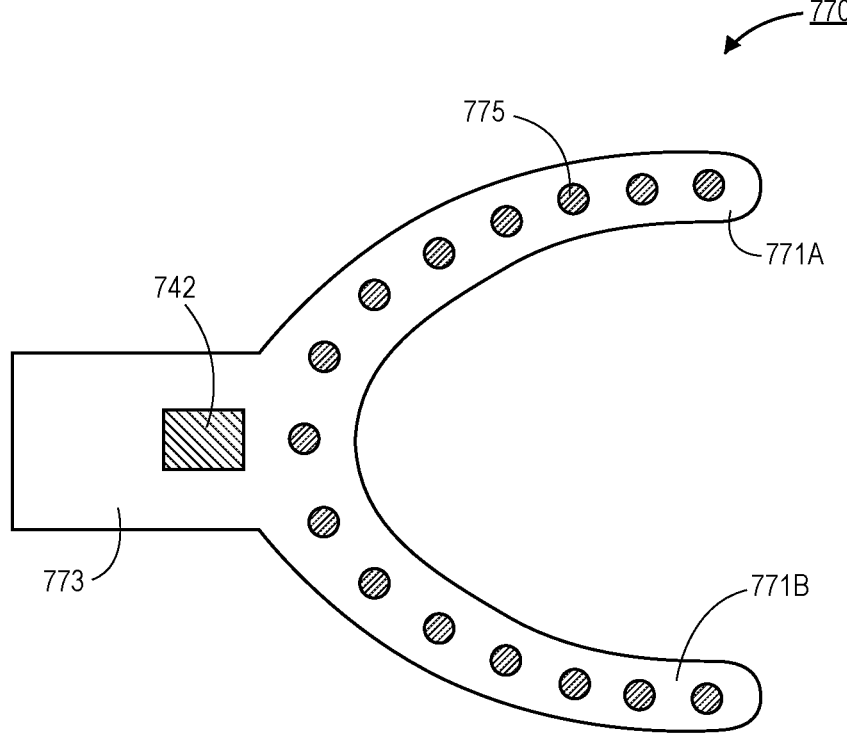
FIG. 7B is a plan view illustration of a robot blade with a forked design that includes sensors for detecting wafer bow or warpage, in accordance with an embodiment.

Referring now to FIG. 7B, a plan view illustration of a robot blade 770 is shown, in accordance with an additional embodiment. Instead of a circular support surface 771, the support surface 771 has a pronged or forked structure. A first prong 771A and a second prong 771B may extend out from the arm 773. Sensors 775 may be provided along the surfaces of each of the prongs 771A and 771B.

Referring now to FIGS. 8A-8D, cross-sectional illustrations depicting support surfaces 871 and overlying substrates 880 are shown, in accordance with various embodiments. The support surfaces 871 may be part of robot arms, or any other component within a semiconductor processing tool that handles or moves substrates 880 throughout the tool.

Figure 8A:
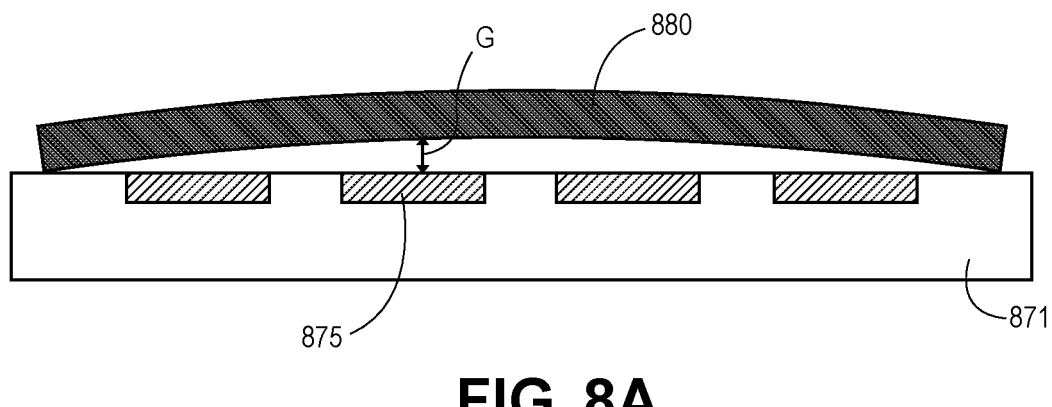
FIG. 8A is a cross-sectional illustration of a bowed wafer supported on a robot blade with integrated sensors, in accordance with an embodiment.

Referring now to FIG. 8A, a cross-sectional illustration of a support surface 871 is shown, in accordance with an embodiment. A plurality of distance sensors 875 may be distributed across a top surface of the support surface 871. In an embodiment, the sensors 875 may comprise capacitance based sensors, such as mutual capacitance sensors. The substrate 880 may be supported on the support surface 871. The substrate 880 may include a wafer, such as a silicon wafer or any other type of semiconductor material.

In an embodiment, the substrate 880 may be bowed. For example, in FIG. 8A, the substrate 880 is bowed so that the center is spaced away from the support surface 871 by a gap G. As can be appreciated, the plurality of distance sensors 875 are able to determine the length of the gap G at multiple locations. This enables the determination of the extent of the bowing in the substrate 880. This information can be used during processing in order to improve manufacturing outcomes.

Figure 8B:
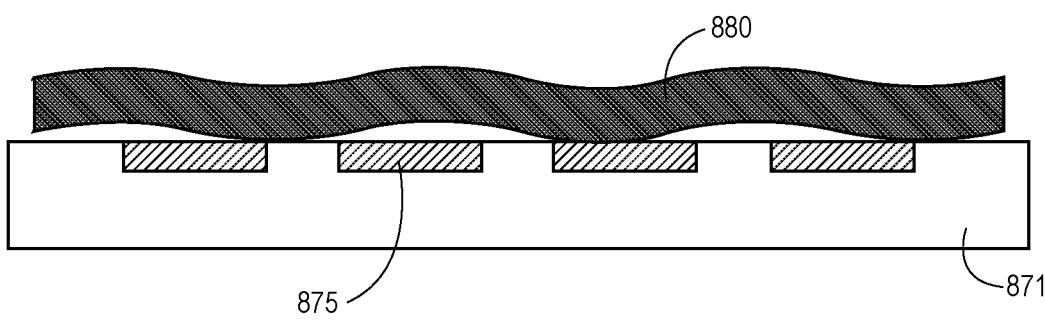
FIG. 8B is a cross-sectional illustration of a warped wafer supported on a robot blade with integrated sensors, in accordance with an embodiment.

Referring now to FIG. 8B, a cross-sectional illustration of a support surface 871 is shown, in accordance with an additional embodiment. In an embodiment, the support surface 871 and distance sensors 875 may be similar to the support surface 871 and sensors 875 in FIG. 8A. However, the substrate 880 may have a more complex warpage profile. For example, a wave profile or any other warpage may be present on the substrate 880. The sensors 875 allow for the measurement of distances between the support surface 871 and the substrate 880 at multiple locations. This enables a determination of the degree of warpage in the substrate 880.

Figure 8C:
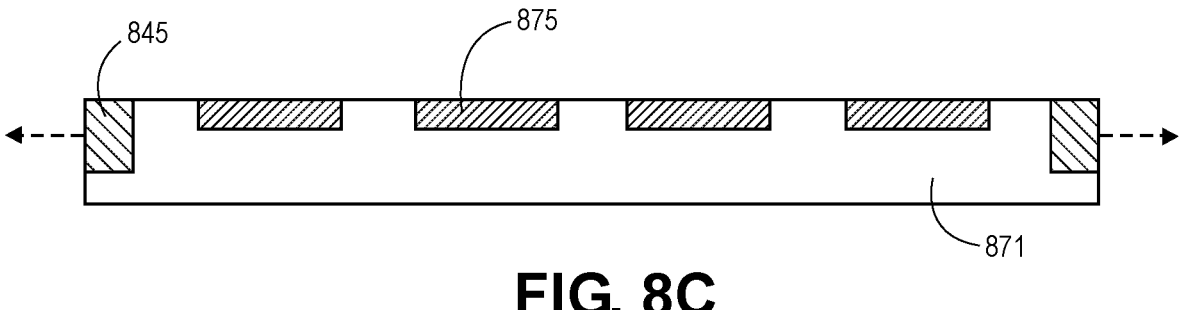
FIG. 8C is a cross-sectional illustration of a robot blade with capacitive sensors and laser sensors, in accordance with an embodiment.

Referring now to FIG. 8C, a cross-sectional illustration of a support surface 871 is shown, in accordance with an additional embodiment. In an embodiment, the support surface 871 may include a plurality of first sensors 875, such as capacitance based sensors. The first sensors 875 may sense distances to external objects (e.g., wafers/substrates) that are provided above the support surface 871. Additionally, second sensors 845 may be provided along the edges of the support surface 871. The second sensors 845 may be laser based sensors that are oriented substantially orthogonally to the first sensors 875.

Figure 8D:
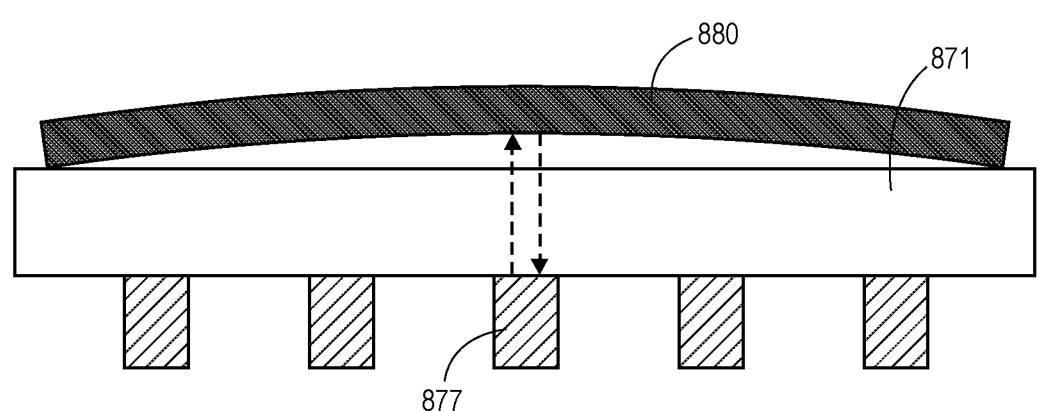
FIG. 8D is a cross-sectional illustration of a robot blade with interferometers to detect warpage or bowing in an overlying wafer, in accordance with an embodiment.

Referring now to FIG. 8D, a cross-sectional illustration of a support surface 871 is shown, in accordance with an additional embodiment. In an embodiment, sensors 877 may be provided below the support surface 871. The sensors 877 may be laser based sensors, such as interferometers. The sensors 877 may be oriented so that the laser passes through the support surface 871 in order to reflect off of an overlying substrate 880, as indicated by the dashed arrows. As such, the support surface 877 may be a material that is transparent to the wavelength of the laser used for the sensors 877. For example, the support surface 871 may comprise glass, sapphire, or the like. In an embodiment, the sensors 877 may be used to measure a warpage of the substrate 880, similar to embodiments described in greater detail above.

Figure 9:
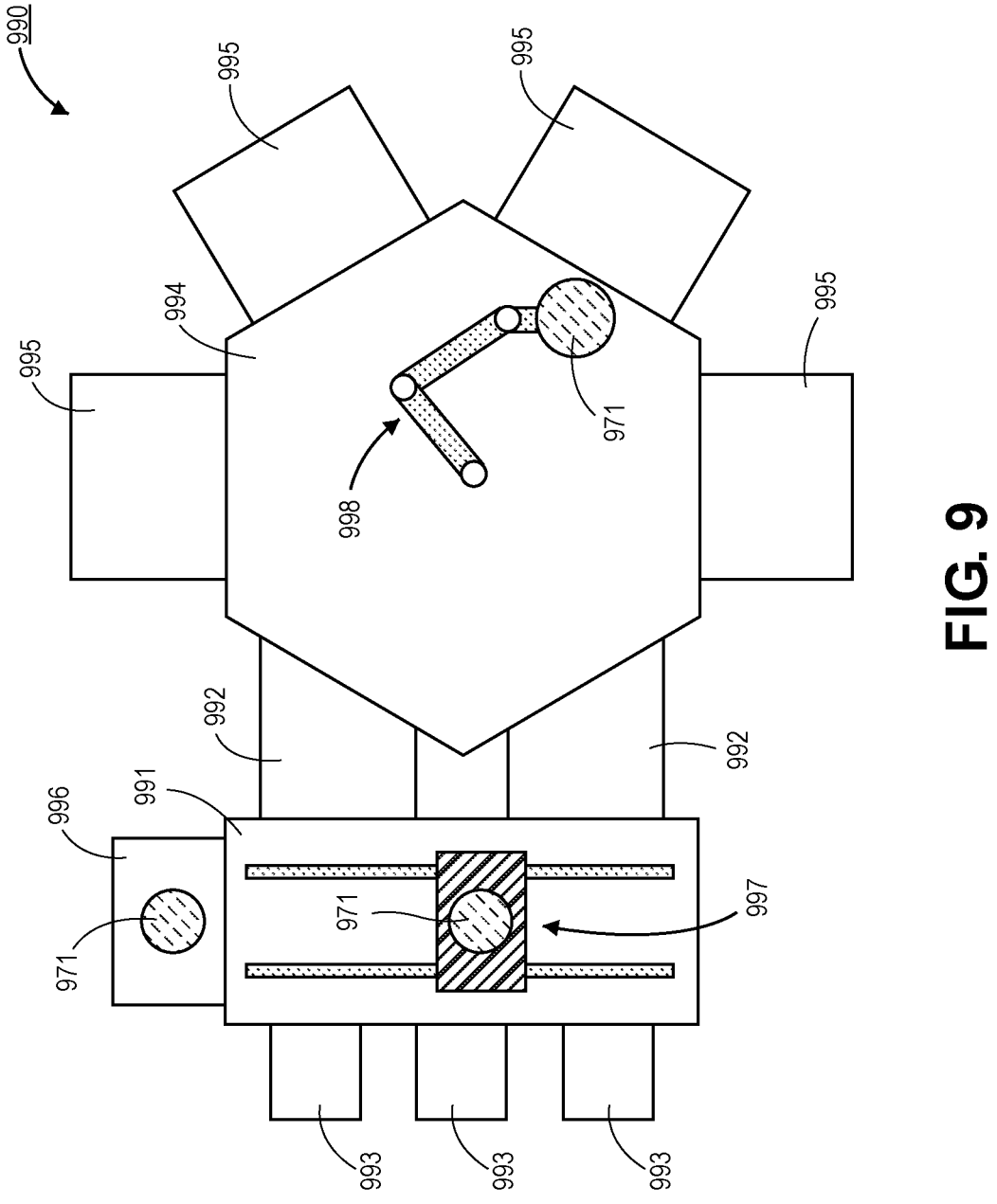
FIG. 9 is a plan view illustration of a cluster tool that includes wafer handling equipment that incorporates sensors for detecting wafer bowing or warpage, in accordance with an embodiment.

Referring now to FIG. 9, a plan view illustration of a semiconductor processing tool 990 is shown, in accordance with an embodiment. In the illustrated embodiment, the semiconductor processing tool 990 may be referred to as a cluster tool since there are a plurality of processing chambers 995. Though, in other embodiments the semiconductor processing tool 990 may include one or more processing chambers 995.

In an embodiment, the semiconductor processing tool 990 comprises a factory interface (FI) 991. The FI 991 may have docking stations for one or more wafer transport devices 993, such as a front opening unified pod (FOUP). An aligner 970 may also be coupled to the FI 991. A transfer robot 997 may be provided within the FI 991 to transport substrates and/or wafers within the FI 991. The transfer robot 997 in FIG. 9 is shown as a track based robot. Though, other robot architectures may also be used.

In an embodiment, a transfer chamber 994 may be coupled to the FI 991 through one or more load locks 992. The transfer chamber 994 may comprise a robot 998 for transporting substrates and/or wafers. For example, the robot 998 may be a multi-axis robot. Though, any type of robot architecture may be used.

In an embodiment, one or more processing chambers 995 are coupled to the transfer chamber 994. The processing chambers 995 may include any type or types of processing chambers. For example, the processing chambers 995 may include, but are not limited to, one or more of an etching chamber, a deposition chamber (e.g., physical vapor deposition (PVD), chemical vapor deposition (CVD), atomic layer deposition (ALD), etc.), a resist exposure tool, a resist development chamber, a treatment chamber (e.g., plasma treatment, thermal treatment, etc.), or the like.

In an embodiment, one or more support surfaces 971 are provided in the chamber. The support surfaces 971 may be integrated with one or both of the robots 997 and 998. A support surface 971 may also be integrated with the aligner 996. The support surfaces 971 may be similar to any of the support surfaces described in greater detail herein. For example, the support surfaces 971 may incorporate a plurality of distance sensors (not shown), such as capacitance based sensors or laser based sensors. The plurality of distance sensors may be used in order to identify warpage and/or bowing of substrates and/or wafers that are being transferred and processed within the semiconductor processing tool 990.

Figure 10:
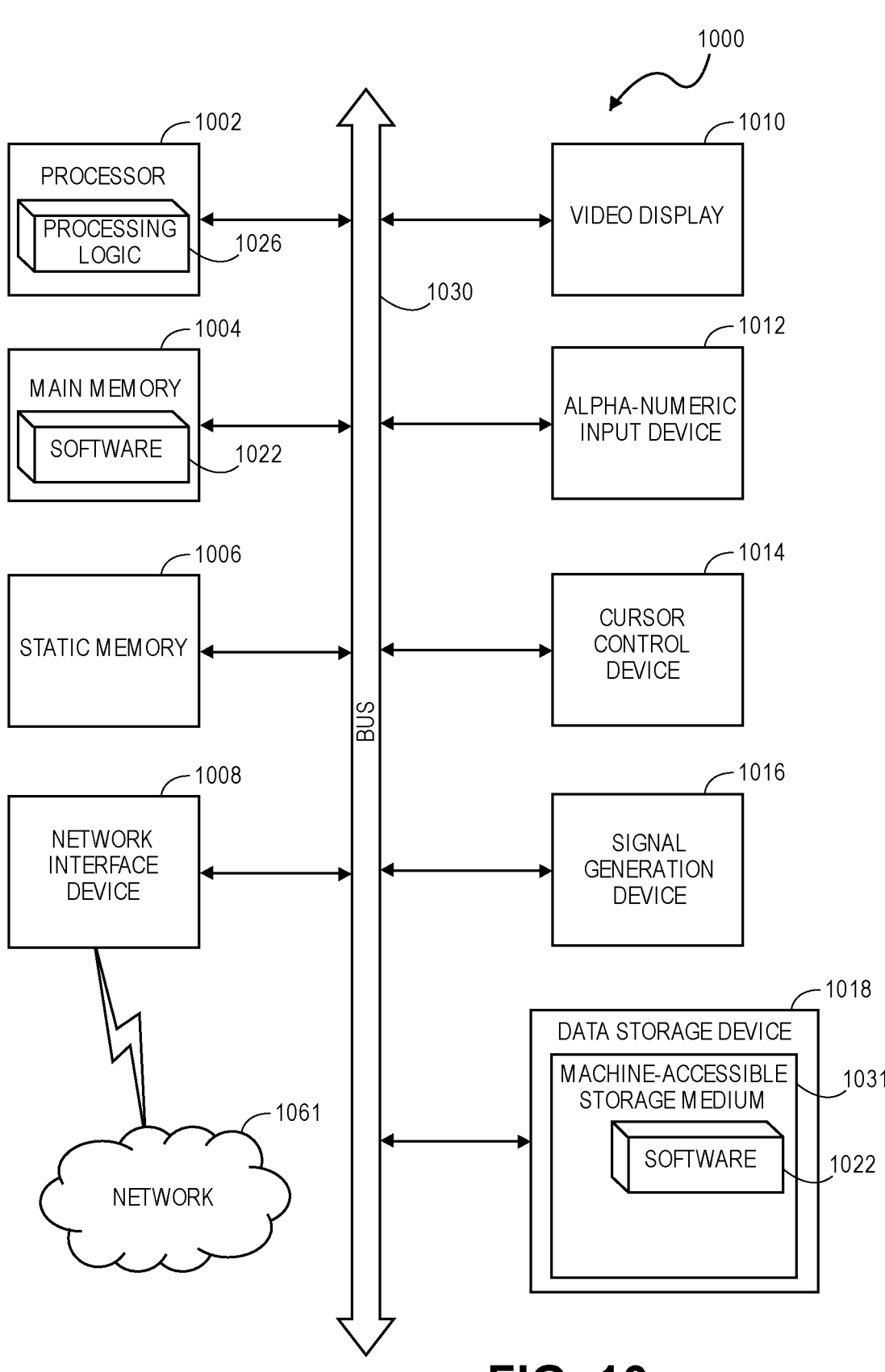
FIG. 10 illustrates a block diagram of an exemplary computer system that may be used in conjunction with a processing tool, in accordance with an embodiment.

Referring now to FIG. 10, a block diagram of an exemplary computer system 1000 of a processing tool is illustrated in accordance with an embodiment. In an embodiment, computer system 1000 is coupled to and controls processing in the processing tool. Computer system 1000 may be connected (e.g., networked) to other machines in a Local Area Network (LAN), an intranet, an extranet, or the Internet. Computer system 1000 may operate in the capacity of a server or a client machine in a client-server network environment, or as a peer machine in a peer-to-peer (or distributed) network environment. Computer system 1000 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1000, the term "machine" shall also be taken to include any collection of machines (e.g., computers) that individually or jointly execute a set (or multiple sets) of instructions to perform any one or more of the methodologies described herein.

Computer system 1000 may include a computer program product, or software 1022, having a non-transitory machine-readable medium having stored thereon instructions, which may be used to program computer system 1000 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1000 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1000 may further include a system network interface device 1008 for communicating with other devices or machines. The computer system 1000 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1032 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1000, the main memory 1004 and the system processor 1002 also constituting machine-readable storage media. The software 1022 may further be transmitted or received over a network 1020 via the system network interface device 1008. In an embodiment, the network interface device 1008 may operate using RF coupling, optical coupling, acoustic coupling, or inductive coupling.

While the machine-accessible storage medium 1032 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An apparatus, comprising:
a substrate with a first surface, a second surface opposite from the first surface, and a sidewall surface coupling the first surface to the second surface;
a plurality of sensors around perimeter of the substrate for measuring distances between the sidewall surface and an external object;
an accelerometer on the substrate, the accelerometer laterally surrounded by the plurality of sensors; and
a processor communicatively coupled to the plurality of sensors.

2. The apparatus of claim 1, wherein the plurality of sensors are capacitive sensors.

3. The apparatus of claim 2, wherein each capacitive sensor comprises a first electrode and a second electrode adjacent to the first electrode.

4. The apparatus of claim 2, wherein the capacitive sensors are provided on the sidewall surface of the substrate.

5. The apparatus of claim 1, wherein the plurality of sensors comprise optical interferometers.

6. The apparatus of claim 1, further comprising:
a plurality of second sensors for measuring distances between the first surface and a second external object, wherein the plurality of sensors are oriented to sense distances in a first direction and the plurality of second sensors are oriented to sense distances in a second direction that is substantially orthogonal to the first direction.

7. The apparatus of claim 1, wherein the substrate has a form factor similar to a standard silicon wafer.

8. The apparatus of claim 1, wherein the plurality of sensors comprises at least three sensors.

9. The apparatus of claim 1, wherein the external object is a dielectric chuck or a metal chuck.

10. An apparatus, comprising:
a support surface;
an array of sensors coupled to the support surface, wherein the sensors are configured to measure a distance between the apparatus and an object external to the apparatus, wherein the distance is in a direction substantially orthogonal to the support surface;

an accelerometer on the support surface, the accelerometer laterally surrounded by the array of sensors; and
a processor coupled to the array of sensors.

11. The apparatus of claim 10, wherein the support surface is part of an aligner.

12. The apparatus of claim 10, wherein the support surface is a blade of a wafer handling robot.

13. The apparatus of claim 10, wherein the plurality of sensors are capacitive sensors.

14. The apparatus of claim 10, wherein the plurality of sensors are interferometers that are mounted below the support surface, and wherein the support surface is transparent to electromagnetic radiation of the interferometers.

15. The apparatus of claim 10, wherein the external object is a wafer supported on the support surface.

16. The apparatus of claim 15, wherein the plurality of sensors detect a warpage of the wafer.

17. A semiconductor processing tool, comprising:
a factory interface, wherein the factory interface comprises:
an aligner; and
a wafer handling robot, and wherein one or both of the aligner and the wafer handling robot comprise a first plurality of sensors for measuring distances between a support surface and a wafer to determine a bow of the wafer, the wafer having an accelerometer laterally surrounded by a second plurality of sensors;
a load lock coupled to the factory interface; and
a processing chamber coupled to the load lock.

18. The semiconductor processing tool of claim 17, further comprising:
a transfer chamber between the load lock and the processing chamber, wherein the transfer chamber comprises a second wafer handling robot with a blade that includes a third plurality of sensors for measuring the bow of the wafer.

19. The semiconductor processing tool of claim 17, wherein the first plurality of sensors comprise capacitive sensors or interferometers.

* * * * *